United States Patent [19]

Baldi

[11] Patent Number: 4,816,883
[45] Date of Patent: Mar. 28, 1989

[54] NONVOLATILE, SEMICONDUCTOR MEMORY DEVICE

[75] Inventor: Livio Baldi, Agrate Brianza, Italy

[73] Assignee: SGS Microelettronica S.p.A., Italy

[21] Appl. No.: 64,480

[22] Filed: Jun. 22, 1987

[30] Foreign Application Priority Data

Jul. 10, 1986 [IT] Italy .............................. 83630 A/86

[51] Int. Cl.$^4$ ..................... H01L 29/78; H01L 27/02; G11C 11/34
[52] U.S. Cl. ..................................... 357/23.5; 357/42; 365/185
[58] Field of Search .................. 357/23.5, 42; 365/185

[56] References Cited

U.S. PATENT DOCUMENTS 4,016,588  4/1977  Ohya et al. ......................... 357/23.5
4,686,558  8/1987  Adam ................................. 357/23.5

Primary Examiner—Martin H. Edlow
Assistant Examiner—Robert P. Limanek
Attorney, Agent, or Firm—Pollock, Vande Sande & Priddy

[57] ABSTRACT

A nonvolatile, EPROM type memory cell, formed using a p-channel MOS device instead of an n-channel MOS device as customary according to the prior art, offers several advantages: improved programming characteristics, a relatively low gate voltage for writing, a lower power dissipation and above all compatability with the great majority of CMOS fabrication processes. An explanation of such surprising characteristics may be attributed to more favorable conditions of electric field during programming, i.e. during charging of the floating gate, in respect to those existing in the case of the conventional n-channel memory cell.

8 Claims, 3 Drawing Sheets

A-A' B-B'

NONVOLATILE, SEMICONDUCTOR MEMORY DEVICE

The present invention relates, in general, to semiconductor memory devices and, more precisely, to electrically programmable, read-only memory devices, utilized in microprocessor based systems, in dedicated nonvolatile memories, in TV channel selectors and in other like systems.

Electrically programmable, nonvolatile, read-only memories, constitute a segment of increasing importance in the field of integrated circuits.

Such memories, generally formed by a large number of elementary memory devices (or cells), are divided in two classes known, respectively, with the acronyms EPROM (electrically programmable and erasable by means of irradiation with U.V. light) and EEPROM (electrically erasable and programmable). In particular, the present invention relates to the field of memories belonging to the first of such two classes.

The typical structure of and elementary device or memory cell of the EPROM type is shown, in schematic form, in the annexed FIG. 1. The device is formed essentially by an n-channel MOS transistor having two superimposed gates 1 and 2. The lower gate 1 is electrically insulated from the rest of the circuit and is called "floating gate", while the top gate 2, connected to the rest of the circuit and called control gate, is used both for writing (programming) the memory cell, and for reading the data stored therein.

In order to write data in the memory cell, i.e. for charging the floating gate, electrons in the channel region of the device are excited by intense electric fields, allowing the electrons to jump the energy barrier existing between the semiconducting substrate 4 and the thin dielectric layer constituted by the gate oxide 3. Once the electrons penetrate the gate oxide layer, they easily flow toward the floating gate 1, which is capacitively coupled to the control gate 2, to which a positive potential is applied. The charge so stored in the floating gate remains for very long periods of time, the floating gate being completely insulated from the rest of the circuit. Erasing of the data written in the memory cell may be effected by exposing the device to U.V. light. The electrons absorb photons from the U.V. radiation and reach energy levels sufficient to jump the energy barrier between the conducting material of the floating gate 1 and the gate dielectric material 3 (commonly: polycrystalline silicon and silicon dioxide, respectively) in the opposite direction, flowing back into the semiconducting substrate 4.

Although originally, the method followed for generating energetic electrons to be used for writing was that of causing "breakdown" of the drain junction, this technique has revealed itself hardly controllable and destructive. Nowadays, almost exclusively, the technique followed is based on the generation of "hot" electrons (having high kinetic energy) in n-channel MOS transistors by applying appropriate voltages to the control gate and the drain of the device. This technique requires the application of high drain voltages(typically between +10 and +12 V) and gate voltages (typically +12 V), corresponding to about +5 V or +6 V on the floating gate, in order to generate the desired gate currents (on writing).

Under these conditions, writing of the data in the memory cell is accompanied by strong drain currents and by the injection of strong currents into the substrate of the integrated circuit. This second occurrence is particularly disadvantageous when a CMOS fabrication process is utilized for making the device, in so far as the currents injected into the substrate during the writing of data in the cells may provoke parasitic bipolar phenomena (latchup). Moreover, in order to collect to ground such currents, avoiding parasitic polarizations of the substrate, it is necessary to ensure a good electrical connection of the substrate itself to ground. This in a CMOS process, does not allow placing the memory cells in a well because the cells being n-channel devices, they require an n-well process.

Because of the adopted mechanism for writing data, that is for charging the floating gate, this type of nonvolatile memory device is always formed by an n-channel MOS device. It has always been the opinion of the expert of the field, amply supported by the relevant literature, that only in an n-channel MOS device would it be possible to obtain an adequate "multiplication" of carriers in the channel region, i.e. within the inversion layer induced by the electric field. It is in fact known that electrons have a much greater mobility (3 times) than holes and therefore they are more strongly accelerable within the depletion region up to reach a sufficient kinetic energy, before undergoing a collision with the crystal lattice, and such as to generate other electron-hole pairs, i.e. bring other electrons from the valence band to the conduction band.

Until today it has, therefore, been considered unpracticable to make such EPROM memory cells with p-channel MOS devices, in so far as the possibility of generating a sufficient number of electrons with high energy in the channel has been thought to be very difficult.

In contrast with such a consolidated practice and opinion, the author of the present invention has surprisingly found that a nonvolatile, floating gate, memory device may be advantageously made by means of a p-channel MOS device and that such a memory device may be written by utilizing a relatively low control gate voltage at a speed more or less similar or even greater than that of a comparable n-channel device of the prior art.

Recent experiments made on a p-channel device made with advanced techniques and, in particular, with gate oxide thickness comprised between 250 and 300 Å, have surprisingly revealed that in a floating gate memory cell made with a p-channel device, under particular biasing conditions, it is possible to generate an electron current injected in the floating gate much greater than that which may be generated in conventional n-channel devices.

Obtaining such a high current of electrons injected in the floating gate, though in presence of a much lower density of high kinetic energy electrons than in comparable n-channel devices of the prior art, is thought to be attributable to the fact that in a p-channel device the electric field existing across the gate oxide layer during the writing of the data in the cells, favors the jumping, by part of the excited electrons, of the energy barrier existing between the substrate silicon and the gate silicon oxide. According to the same kind of consideration, in the case of the n-channel memory device of the prior art, the electric field would oppose such a jump of the same energy barrier by part of the electrons.

In fact, in order to write the memory cell, it is necessary that two effects take place: generation of electrons by impact ionization and injection of the same in the floating gate. The generation by impact ionization of carriers takes place when the transistor is saturated, that is when the drain voltage is, in terms of absolute value greater than the difference between the gate voltage and the threshold voltage. Under these conditions, for an n-channel transistor, the gate is negative in respect to the drain and therefore the electric field opposes the injection of electrons into the floating gate. Under the same conditions, in p-channel transistors, the gate is positive in respect to the drain and therefore the electric field favors the injection of electrons into the floating gate.

Essentially, in the case of n-channel devices, the electric field between the gate of the device and the drain region opposes the passage of electron from the silicon to the floating gate, while in the case of p-channel memory devices, the object of the present invention, the electric field between the gate and the drain region of the device results favorably to the passage of the electrons from the silicon to the floating gate.

The p-channel, floating gate, memory device, objects of the present invention, offer a number of advantages in respect of the n-channel devices of the prior art. In particular:

(i) since the write operation may take place at relatively lower gate voltage than the voltage normally used in n-channel devices, a large capacitive coupling between the control gate and the floating gate is no longer necessary and this permits the reduction of the area occupied by a single elementary cell;

(ii) since the values of gate currents during writing of data are greater than those of comparable n-channel devices, a greater programming speed is possible;

(iii) the maximum gate current value during writing of the data is obtained for much lower values of the current injected in the substrate in respect to the n-channel devices. This reduces the incidence of problems due to the turning on of parasitic bipolar devices and to the parasitic biasing of the substrate;

(iv) the drain currents drawn are much lower than those of n-channel devices, thus making it possible to limit power dissipation;

(v) p-channel memory cells are compatible with p-well fabrication processes which constitute the majority of presently used CMOS fabrication processes.

The p-channel memory devices object of the present invention may find different applications. Two fundamental applications may be indicated as having a particular practical interest, namely:

(a) starting from MOS devices with normal threshold voltage of about −1 V, "depletion" devices may be obtained, upon writing. These devices are not compatible with a traditionally structured EPROM memory, but they may be advantageously used in special devices in place of fuses to provide a certain reversible programming capability at a low cost;

(b) by utilizing devices with a threshold voltage purposely increased to about −3 V/−4 V, by means of an impurity implantation step, e.g. phosphorus or arsenic according to the known technique, transistors with a threshold voltage of about −1 V may be easily obtained, upon writing, and, therefore, readily compatible with a normal EPROM memory structure.

A particularly preferred embodiment of the memory device object of the present invention will now be described as well as a fabrication process of the same and such a description will be made easier through reference to a series of drawings annexed to the present specification, wherein.

Figure 12:
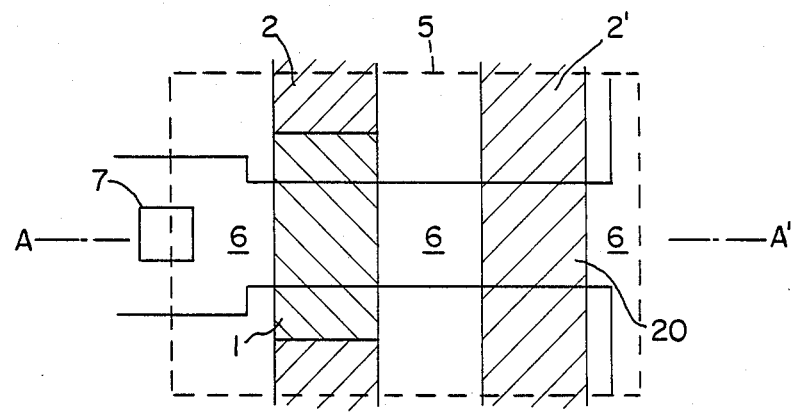
Figure 13:
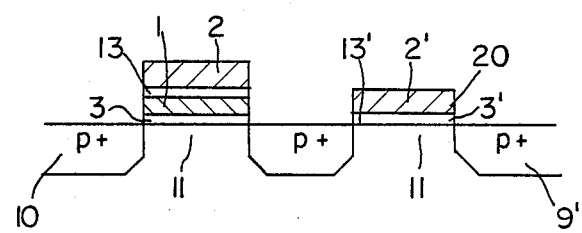

FIGS. from 5 to 11 show the sequence of the fabrication process operations for making the elementary memory cell structure of the present invention;

FIG. 12 is a plan view of an elementary memory cell of the invention, according to an alternative embodiment;

FIG. 13 is a partial section view of the memory cell of FIG. 12, along the section line A–A'.

Figure 1:
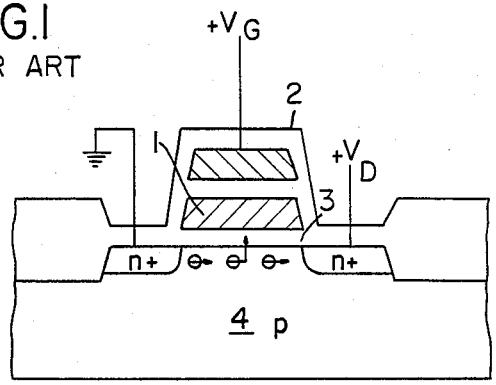
FIG. 1 shows, as already described before, a schematic illustration of an n-channel, nonvolatile, floating gate, semiconductor memory device or cell of the prior art.
Figure 2:
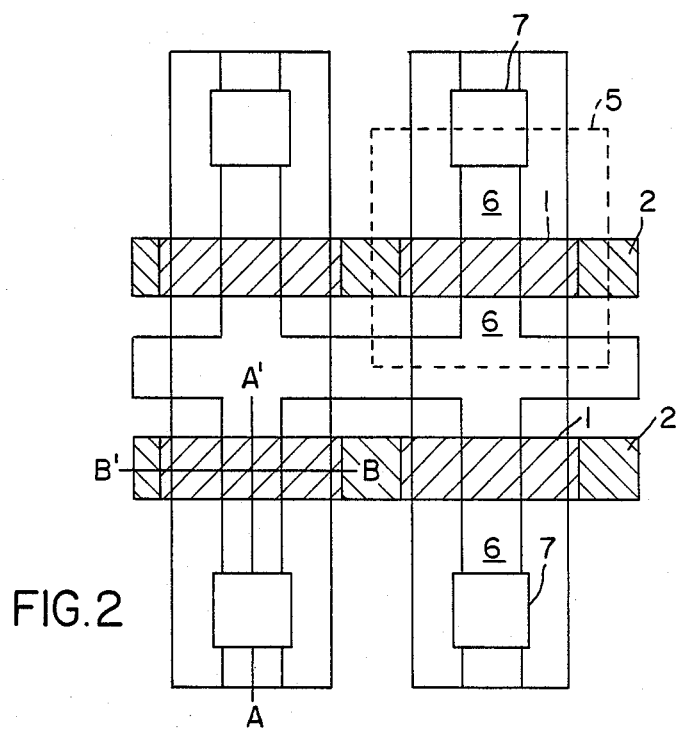
FIG. 2 is a simplified plan view of an EPROM memory formed by an array of elementary memory cells.

As shown in FIG. 2, the EPROM memories are formed by a large number of elementary memory cells of the invention arranged in an array of rows and columns. In FIG. 2, four elementary cells are shown, the area occupied by a single elementary memory cell is indicated by the dash line 5. The areas shown with 6 comprised within the intersecting strips are the "active" areas of the silicon substrate, i.e. areas not covered by the field oxide. The control gate of the various elementary cells is represented by the hatched strip 2; while the underlying floating gate structure is shown by the cross hatched zone 1. The drain (or column) contact of each elementary cell is represented by the respective blackened square 7.

Figure 3:
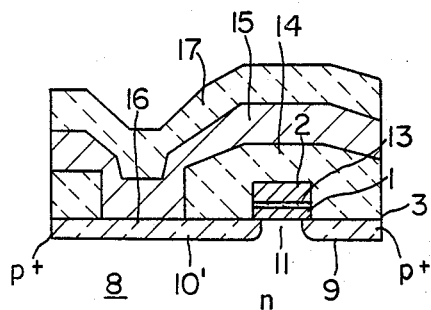
FIG. 3 is a partial cross section view of an elementary cell of FIG. 2, along the section line A–A'.
Figure 4:
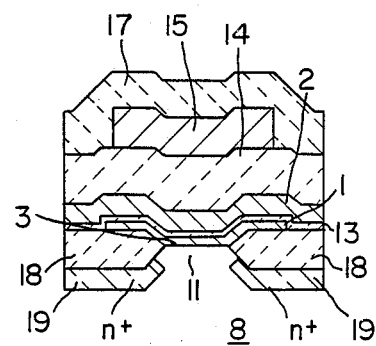
FIG. 4 is a section view of the same elementary cell of FIG. 2, along the section line B–B'.

In section, the single elementary cell appears as shown in FIGS. 3 and 4 which are cross sections, one perpendicular in respect to the other, respectively along the direction A—A' and along the direction B—B' shown in FIG. 2.

In FIG. 3 it may be observed that, in an n silicon substrate 8, two p+ doped regions 9 and 10 are formed, which represent the source region and the drain region of the device, respectively. The channel region is comprised between said source and drain regions and is indicated with 11 in the figures.

By observing FIG. 3, above the channel region 11 and insulated from this by a layer of gate silicon oxide 3, there is the floating gate 1 formed by a layer of polycrystalline silicon suitably doped for increasing its bulk electrical conductivity. An insulating layer 13 of silicon oxide or of an equivalent dielectric, grown by heat treatment or deposited by chemical vapor deposition, electrically insulates the polycrystalline silicon of the first level, that is the floating gate structure 1, from a second level 2 of polycrystalline silicon which represents the control gate structure of the device. A suitable layer of dielectric material 14 insulates the gates of the device from the metal layer 15, through which the necessary drain contacts 16 are formed and a further layer of passivating dielectric material 17 seals the entire structure of the cells.

Along the direction perpendicular to that of the section of FIG. 3, the elementary memory cell has a cross section as the one shown in FIG. 4, wherein the same numbers indicate the same parts already illustrated in relation to the description of the preceding figure. As it may be observed, the layer of dielectric material 13 insulates completely the structure of the floating gate 1 from the control gate 2. In this section is visible the field oxide 18, which defines the active area of the elementary cell and of the n+doped region 19 underlying the field oxide 18 which, together with the layer of field oxide, constitutes the isolation structure between adjacent active areas, i.e. between adjacent devices.

According to a preferred embodiment of the invention, the n doped silicon substrate 8 has a bulk resistivity of about 2–3 ohms.centimeters.

The source and drain regions 9 and 10 are obtained by heavily doping with boron the silicon in such regions. The layer of gate oxide 3 has preferably a thickness comprised between 250 and 300 Å.

The programming of the p-channel cell of the invention, shown in FIGS. 2, 3 and 4, is performed by placing the drain of the device at a voltage comprised between 10 and 13 V (depending upon the thickness of the gate oxide layer) and the control gate at about 1 V above the threshold voltage of the device. In these conditions, a much greater gate current in respect to the current obtained in an n-channel device is obtained.

A fabrication process for making the memory device of the invention is exemplified in the series of Figures from 5 to 11, wherein, in each of the figures, it is shown the section of the device being fabricated along each of the two perpendicular directions B-B' and A-A', indicated in FIG. 2.

Figure 5:
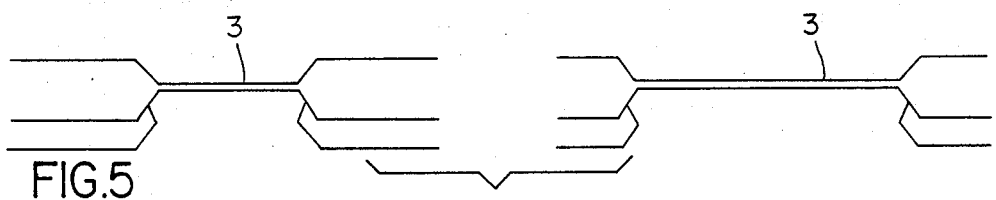
Figure 6:
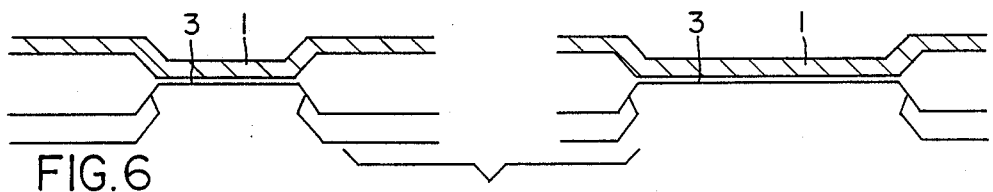
Figure 7:
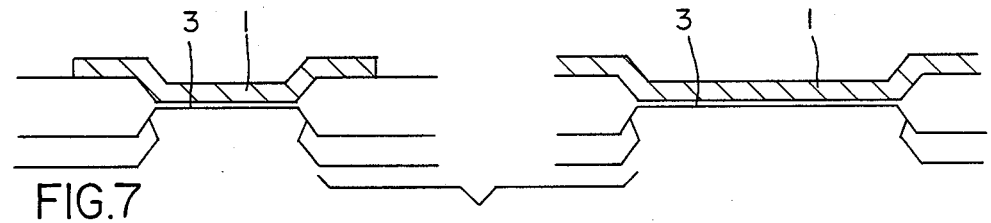
Figure 8:
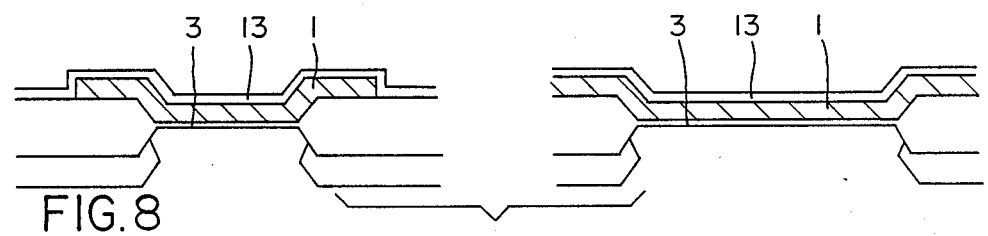
Figure 9:
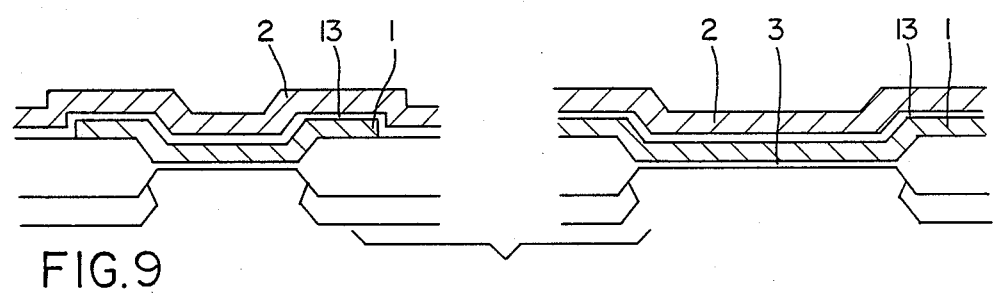
Figure 10:
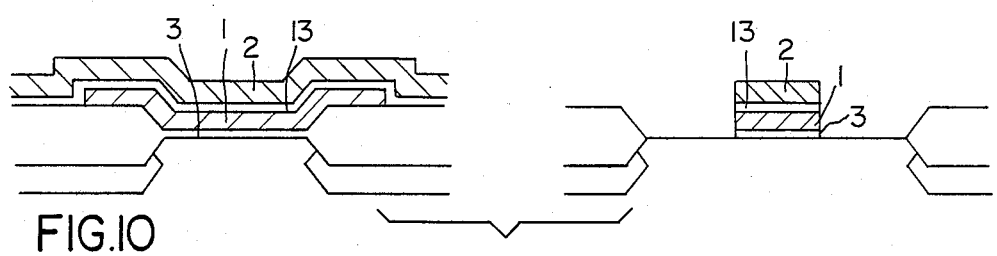
Figure 11:
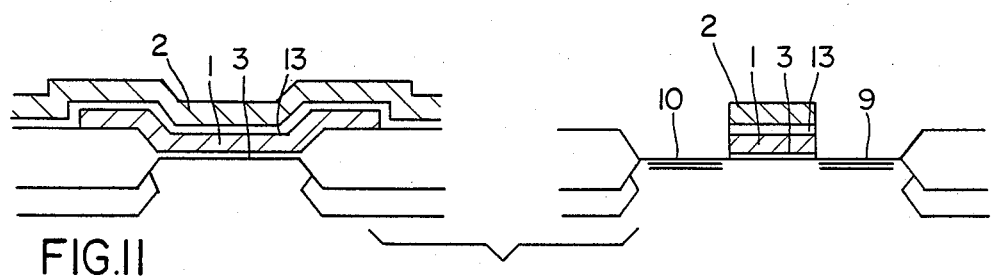

Thus the fabrication process may advantageously be the following:

(1) one proceeds according to a normal CMOS or "p-channel" fabrication process, using the known techniques, until having formed the field isolation structure, defined the active areas and grown a layer of gate oxide 3, having, preferably, a thickness comprised between 250 and 300 Å (FIG. 5); then the process proceeds through:

(2) deposition and doping of the first level 1 of polycrystalline silicon (FIG. 6);

(3) masking and attack of the first level of polycrystalline silicon (FIG. 7);

(4) deposition of a layer 13 of dielectric material for insulating the two layers of polycrystalline silicon (FIG. 8);

(5) removal of the dielectric layer, using an appropriate mask, followed by the deposition and doping of the second level 2 of polycrystalline silicon (FIG. 9);

(6) masking and attack of the two layers 1 and 2 of polycrystalline silicon and of the layer 13 of dielectric material between them (FIG. 10);

(7) p+ doping of the source regions 9 and of the drain region 10 by heavy implantation of boron or by treating with $BF_2$ (FIG. 11), (this process step requires an appropriate mask in case a CMOS fabrication process is followed);

(8) the fabrication process thus proceeds again as a standard CMOS or "p-channel" process according to the known technique.

As already pointed out, according to another embodiment of the present invention particularly suitable for making memory devices which are compatible with the normal EPROM memories, immediately after having grown the gate oxide and before proceeding to the deposition of the first level of polycrystalline silicon, an appropriate implantation step of donor atoms, e.g. phosphorus or arsenic atoms, utilizing an appropriate mask, may be carried out in the active areas of the devices for correcting the threshold voltage of the devices, i.e. for raising the turn-on voltage of the MOS devices bringing it from a normal value of about −1 V to a higher value, comprised between −3 V and −4 V.

Naturally, the p-channel memory devices of the invention may also be fabricated by somewhat different process sequences from the ones described above; e.g. the gate oxide layer for the circuitry associated with the memory array (e.g. for the circuitry using a single level of polycrystalline silicon) may conveniently be made in a single operation during the formation of the layer of dielectric material over the first level or layer of polycrystalline silicon (stage 4 of the above described sequence).

Because of reduced substrate current, the p-channel memory cell of the invention may also be formed in an "n-well" suitably formed in a substrate of semiconductor material of a different type of conductivity (e.g. a p doped silicon die).

According to a particularly preferred embodiment of the invention shown in FIGS. 12 and 13, the elementary memory cell, comprising, as described before, a p-channel MOS structure with two levels of polycrystalline silicon, with a threshold voltage normally of about −1 V and being in "depletion" once it is written, comprises further a standard p-channel MOS transistor, having a threshold voltage of about −1 V, in series with the memory MOS structure having two levels of polycrystalline silicon.

This selection or select series transistor, which permits reading of the memory cell, allows reduction of the power dissipation; in fact, the passage of electric current through the written cell will occur only when the latter is addressed. In FIGS. 12 and 13, the same numbers are used for indicating the same parts of FIGS. 2, 3 and 4. Within the area occupied by a single memory cell, indicatively evidenced by the dash line 5, a p-channel MOS transistor 20 is formed. Conveniently, the gate structure 2' of the select transistor 20, which is formed over the channel region 11' and is insulated from the silicon by the gate oxide layer 3', will be constituted by the second level polycrystalline silicon of the memory cell structure, i.e. it will be formed during the deposition of said second level of polycrystalline silicon contemplated by the fabrication process of the floating gate memory cell structure.

Though formation of the select transistor 20 in series with the floating gate memory device on the side of the source region 9 of the latter has been shown in FIGS. 12 and 13, it is also possible to form such a select transistor 20 on the side of the drain region 10 of the floating gate memory devices as it is well known to the expert.

The position and connection of the single memory devices, i.e. of the single elementary cells comprising or not the respective select transistor, to form a single byte of memory is the customary one which is amply described in the relevant literature and well known to the expert of the field.

What I claim is:

1. A nonvolatile, floating gate type, semiconductor memory device, programmable by means of injection of electrons in such a floating gate, formed on a die of semiconductor material and comprising a field effect MOS transistor having two superimposed gates, the lower one or floating gate being essentially electrically insulated from the rest of the circuit and being capacitively coupled to the upper one or control gate, said floating gate extending over a channel region of said semiconductor material of a first type of conductivity, comprised between a drain and a source region of a second type of conductivity of said semiconductor material, means for injecting electrons into said floating gate, said means for injecting including means for applying a negative voltage to said drain region with respect to said source region and, a voltage to said control gate which is negative with respect to said source region and positive with respect to said drain region, the semiconductor material where said channel region is formed having an n type conductivity and said drain and source regions having a p+ conductivity.

2. The nonvolatile memory device according to claim 1, wherein said die of semiconductor material is a slice of n doped monocrystalline silicon having resistivity comprised between 2 and 3 ohms.centimeters and said first and second region of p+ type conductivity are formed by heavily doping with boron the silicon in correspondence thereof.

3. The nonvolatile memory device according to claim 1, wherein said p-channel MOS transistor has a raised threshold voltage.

4. The nonvolatile memory device according to claim 1, wherein in series with each device there is a selection p-channel MOS transistor.

5. The nonvolatile memory device according to claim 1 wherein a plurality of said devices is arranged in an array of rows and columns on the die of semiconductor material.

6. The nonvolatile memory device according to claim 1 wherein said channel region is in an "n-well" region formed in a substrate of a semiconductor material of a p-type of conductivity.

7. The nonvolatile memory device according to claim 4 wherein a plurality of said devices is arranged in an array of rows and columns on the die of semiconductor material.

8. The nonvolatile memory device according to claim 4 wherein said channel region is in an "n-well" region formed in a substrate of a semiconductor material of a p-type conductivity.

* * * * *